United States Patent [19]

Kai et al.

[11] Patent Number: 5,335,047

[45] Date of Patent: Aug. 2, 1994

[54] PRINTING PLATE MAKING APPARATUS FOR TWO DIFFERENT KINDS OF MASTERS

[75] Inventors: Masanori Kai; Satoshi Okabe, both of Hachioji; Nobuyoshi Hatori, Chofu; Toshio Koike; Tamio Iwamoto, both of Hachioji, all of Japan

[73] Assignee: Iwatsu Electric Co., Ltd., Tokyo, Japan

[21] Appl. No.: 5,396

[22] Filed: Jan. 15, 1993

[30] Foreign Application Priority Data

Jul. 17, 1992 [JP] Japan .................................. 4-026141

[51] Int. Cl.⁵ ..................... G03G 15/00; G03G 21/00; G03D 3/08
[52] U.S. Cl. ........................................ 355/200; 355/27
[58] Field of Search ................. 355/200, 219, 256, 27; 354/317

[56] References Cited

U.S. PATENT DOCUMENTS

| | | | |
|---|---|---|---|
| 4,180,319 | 12/1979 | Kaufmann et al. | 355/200 |
| 4,334,755 | 6/1982 | Harrell et al. | 354/317 X |
| 4,573,782 | 3/1986 | Kobayashi et al. | 354/325 X |
| 4,694,748 | 9/1987 | Fujisawa et al. | 355/308 X |
| 4,843,422 | 6/1989 | Mampaey et al. | 355/221 X |
| 4,942,421 | 7/1990 | Gumbinner | 355/27 |

Primary Examiner—Fred L. Braun
Attorney, Agent, or Firm—Oblon, Spivak, McClelland, Maier & Neustadt

[57] ABSTRACT

A printing-plate making apparatus is constructed such that a mode selecting switch adapted to change a master supplying process depending on properties of a master X is disposed on a housing 1 of the printing-plate making apparatus and various conditions, e.g., a master supplying process, locking member 4 for a master supplying roller 3, a temperature preset for a panel heater 33 and a compressing force given by press rollers 35a and 35b are automatically changed to optimal conditions corresponding to masters selected by the mode selecting switch. The printing-plate making apparatus is provided with a master heating switch on the housing 1 of the printing-plate making apparatus and when the master heating switch is actuated, applying of a certain voltage to at least a charger is stopped so that the panel heater 33 arranged at a fixing step is kept in the heated state so as to serve as a master heating unit.

4 Claims, 6 Drawing Sheets

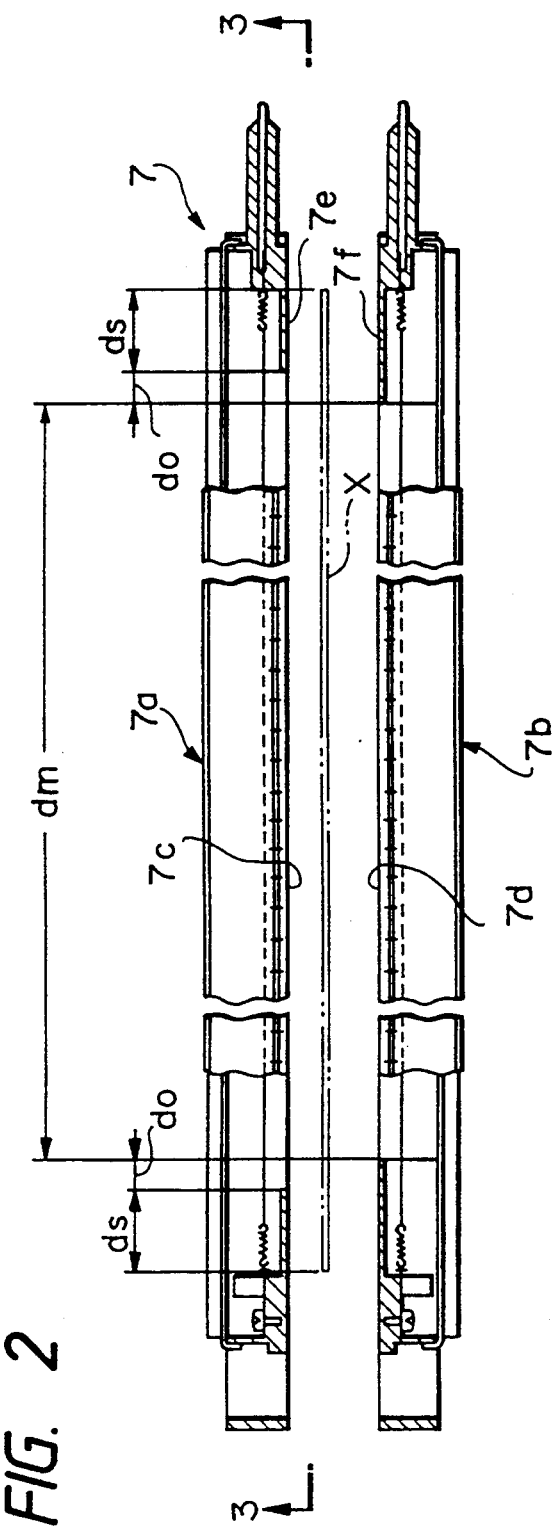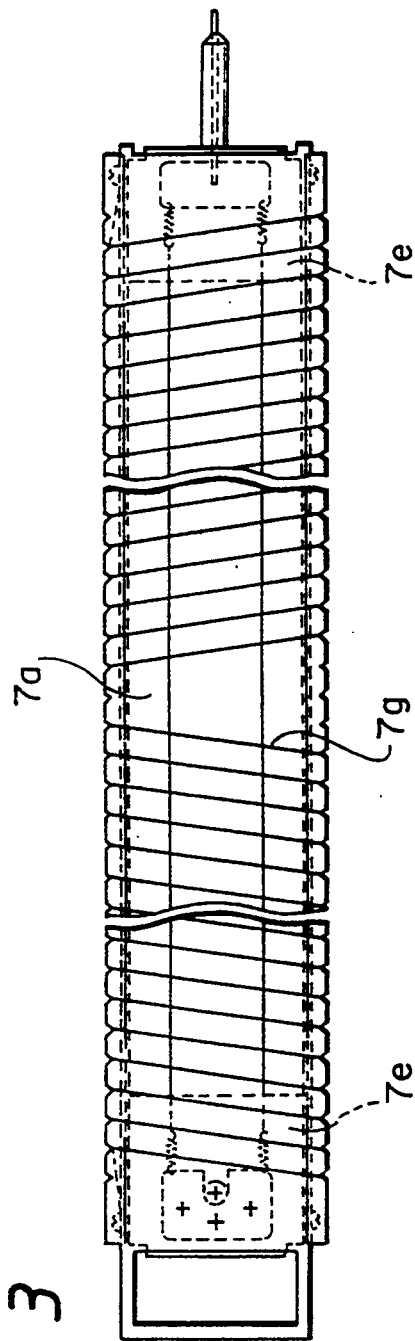

PRINTING PLATE MAKING APPARATUS FOR TWO DIFFERENT KINDS OF MASTERS

BACKGROUND OF THE INVENTION

Field of the Invention

The present invention relates generally to a printing-plate making apparatus for making a master on which an original image for printing operations is formed. More particularly, the present invention relates to a printing-plate making apparatus of the foregoing type including master heating means for effectively performing a subsequent treatment for the purpose of removing a photosensitive layer on a non-image portion of a master made of an aluminum sheet as a base sheet wherein an image of an original is formed on a master plate coated with an organic photosensitive material.

Description of the Related Art

A printing-plate making apparatus of the foregoing type has been hitherto used for making a master on which an image of an original for printing machines is formed. Specifically, the printing-plate making machine is constructed such that a master conveying system on the supply side as well as a master conveying system on the discharge side are horizontally arranged in the side-by-side relationship on the opposite sides of an exposing stage for allowing an image of an original to be exposed to light beam so that after the master is electrically charged in the master conveying system on the supply side, it is conveyed to the exposing stage. After the original image formed on the master is converted into a latent image in the exposing stage, the master is delivered to the conveying system on the discharge side where the latent image is converted into a visible image which in turn is subjected to developing and fixing, and subsequently, the master is taken out from the conveying system on the discharge side so as to allow it to be received on a discharge tray.

With the conventional printing-plate making apparatus constructed in the above-described manner, however, since a master which can be processed therewith is specifically determined depending on the type of printing-plate making apparatus, there arises an occasion that a sheet-shaped zinc oxide master (hereinafter referred to as ZnO master) or an organic photosensitive master plate having an aluminum sheet used as a base sheet (hereinafter referred to as OPC master plate) is selectively employed depending on various conditions, e.g., a printing format, the number of sheets to be printed, a master supplying process or the like. In the circumstanced as mentioned above, a different kind of printing-plate making apparatus is practically employed corresponding to the kind of each master.

Specifically, the ZnO master and the OPC master plate are different from each other in respect of the kind of photosensitive material deposited on the surface of a master, the kind of a base sheet and a thickness of the base material. In addition, they are different from each other depending on the selected master not only in respect of a master supplying process but also in respect of various operative conditions, e.g., an opening area of a lens iris in an optical exposing system, a temperature preset for a panel heater arranged at a fixing step, a compressing force given by press rollers arranged at a fixing step or the like. For this reason, a printing-plate making apparatus exclusively usable for a specific kind of master should be prepared. Thus, there arises a problem that an economical burden to be borne by each printing shop or company is unavoidably increased.

In case of the OPC master plate on which an image of an original is formed by the printing-plate making apparatus, it is very important to properly control a plate temperature for performing a step of subsequent treatment, and moreover, the OPC master plate which has been subjected to developing and fixing should be heated up to a predetermined temperature prior to subsequent treatment to be performed. Thus, there arises a necessity for separately or additionally preparing a master heating unit such as an oven or the like. Due to the foregoing necessity, the economical burden to be borne by each printing shop or company is additionally increased.

SUMMARY OF THE INVENTION

The present invention has been made in consideration of the aforementioned problems to be solved and its object resides in providing a printing-plate making apparatus which assures that both of a zinc oxide master and an organic photosensitive master of which properties are different from each other can be used by actuating a mode selecting switch disposed on a housing of the printing-plate making apparatus, and moreover, the printing-plate making apparatus itself can be used as a master heating unit for heating an organic photosensitive master.

To accomplish the above and other objects, according to one aspect of the present invention, there is provided a printing-plate making apparatus which is constructed such that an electrically charged master cut to predetermined sizes is conveyed to an exposing stage at which a latent image of an original is formed on the master by exposure to light beam, and thereafter, the exposed latent image is developed and fixed, in which a mode selecting switch for selectively changing a master supplying process depending on properties of the master is disposed on a housing of the printing-plate making apparatus, and moreover, various conditions, i.e., a master supplying process, locking means for a master supplying roller, a temperature preset for a panel heater and a compressing force given by press rollers are automatically changed to optimal conditions corresponding to the master selected by actuating the mode selecting switch, wherein the printing-plate making apparatus is provided with a master heating switch is disposed on the housing of the printing-plate making apparatus, and when the master heating switch is actuated, at least applying of a certain voltage to a charger is stopped so that the panel heater arranged at a fixing step is kept in the heated state so as to serve a master heating unit.

Further, according to another aspect of the present invention, when the master heating switch is shifted, movement of an original board is stopped, an illuminating lamp is turned off and applying of a certain voltage to a charger is stopped so that the panel heater arranged at a fixing step is kept in the heated state so as to serve a master heating unit.

In case that a master having an image for printing formed thereon is made by operating the printing-plate making apparatus constructed in the above-described manner, the mode selecting switch disposed on the housing of the printing-plate making apparatus is first actuated. As a result, various conditions, i.e., a master supplying process corresponding to a master selected by actuating the mode selecting switch disposed on the housing of the printing-plate making apparatus, e.g, ZnO master, OPC master plate or the like, an opening area of a lens iris in an optical exposing system, a temperature preset for a panel heater at a fixing step and a compressing force given by press rollers are automatically changed to optimal conditions. Thus, a master having a high quality of image formed thereon can be made by operating a single printing-plate making apparatus irrespective of how properties of each master differ from master to master.

In addition, in case that a latent image of an original is formed on OPC master plate by exposure to light beam, and thereafter, the exposed latent image is developed and fixed by operating of the printing-plate making apparatus of the present invention, after completion of the developing and fixing of the OPC master plate, the master heating switch disposed on the housing of the printing-plate making apparatus is shifted so that the temperature of the panel heater arranged at a fixing step is automatically set to an adequate temperature and at least applying of a certain voltage to the charger is stopped so as to serve a master heating unit. Thus, the OPC master plate can be heated up to a predetermined temperature before it is subjected to subsequent treatment. Consequently, separate or additional arrangement and installation of a master heating unit are not required in contrast with the conventional printing-plate making apparatus.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is an enlarged sectional view of a charger arranged in a housing of the printing plate making apparatus, showing the structure of the charger;

FIG. 3 is an enlarged view of the charger seen along 2-3 in FIG. 2;

The present invention will now be described in detail hereinafter with reference to the accompanying drawings.

Figure 1:
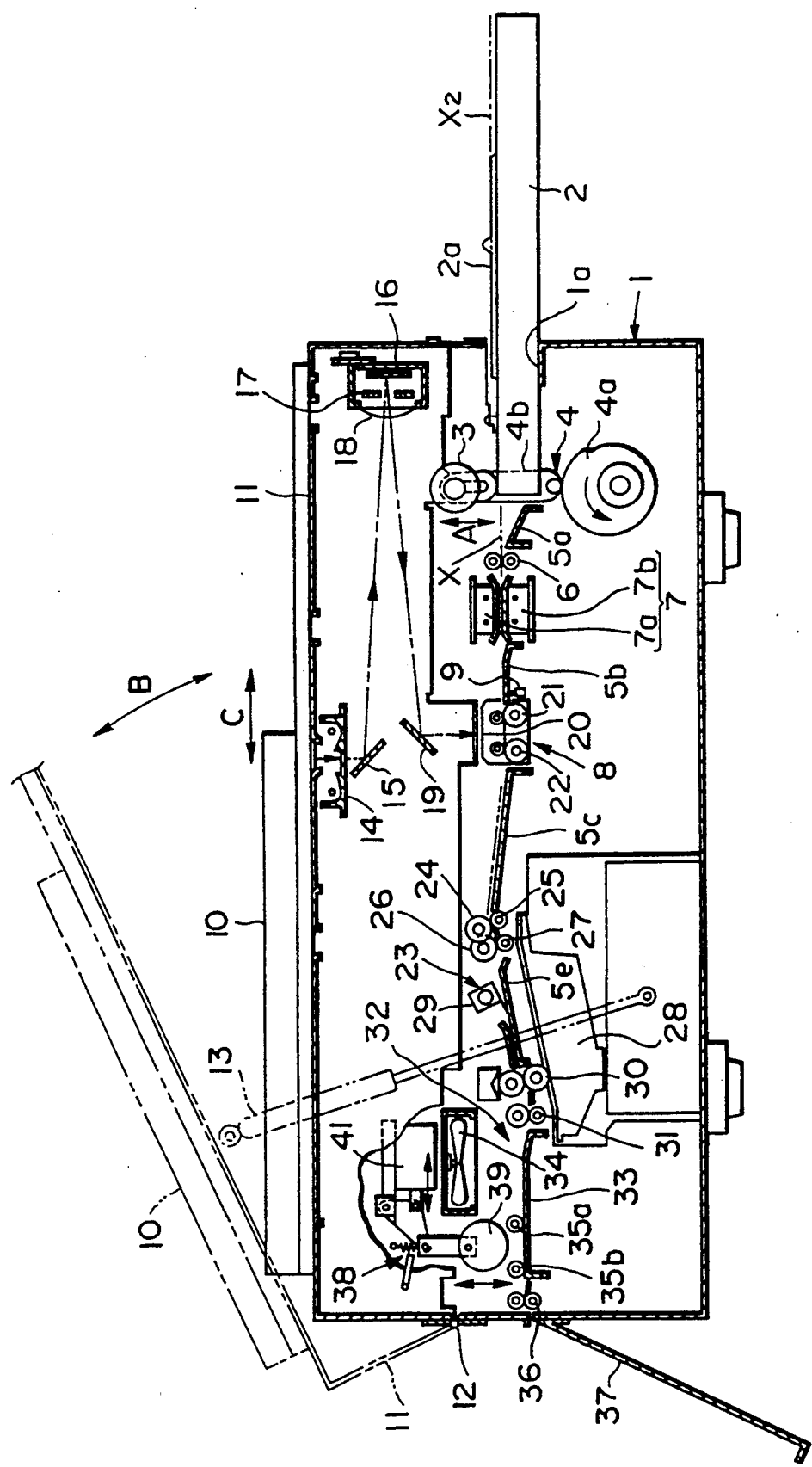
FIG. 1 is a vertical sectional view of a printing-plate making apparatus constructed according to a first embodiment of the present invention, showing the whole structure of the printing plate making apparatus.
Figure 7:
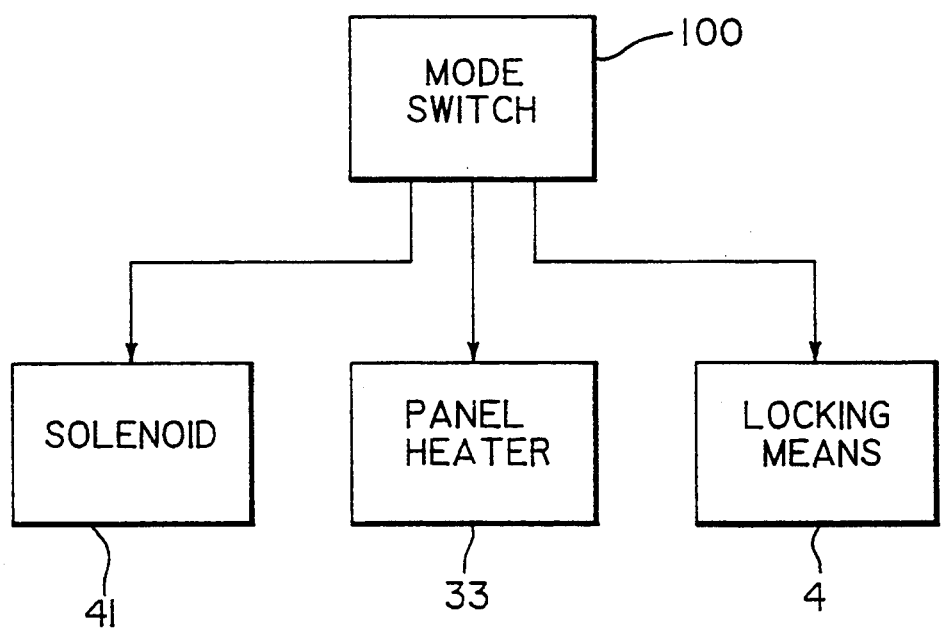
FIG. 7 is a schematic diagram of the mode switch end and its control circuitry.

FIG. 1 is a vertical sectional view of a printing-form making apparatus constructed according to a first embodiment of the present invention, particularly showing the whole structure of the printing-plate making apparatus. The printing-form making apparatus includes a housing 1 in which a conveying system on the supply side is arranged, and an insert slit 1a for a master supply cassette 2 is formed in the conveying system on the master supply side. For example, a number of ZnO masters $X_1$ each cut to predetermined sizes are received in the master supply cassette 2, and a manual insert portion 2a is disposed on the upper surface of an upper cover of the master supply cassette 2 so as to allow OPC master plates $X_2$ to be inserted into the master insert portion 2a one by one with an operator's hand. Although illustration of most switches is neglected for the purpose of simplification, a plurality of switches are disposed at the predetermined positions on the housing 1 of the printing-plate making apparatus in order to properly control various operations of the printing-plate making apparatus. Especially, a mode selecting switch 100 (FIG. 7) for selectively changing a cassette supplying process for ZnO masters $X_1$ to a manual inserting process for OPC master plates $X_2$ depending on the properties of a master X and vice versa as well as a master heating switch for changing usage of the housing 1 of the printing-plate making apparatus to usage of the same as a master heating unit exclusively for OPC master plates $X_2$ are disposed at the predetermined positions on the housing 1 of the printing-plate making apparatus.

A master supply roller 3 for supplying ZnO masters $X_1$ received in the cassette 2 one by one is disposed at the position located above the foremost end of the cassette 2 on the insert side in such a manner that it can be displaced in the upward/downward direction, i.e., in the A arrow-marked direction. When the manual supplying process is selected by actuating the mode selecting switch so as to allow OPC master plates $X_2$ to be inserted from the manual supply portion 2a, the master supply roller 3 is locked at the elevated position with the aid of a cam 4a, an arm 4b and associated components each constituting roller elevated position locking means 4. On the contrary, when the cassette supplying process is selected by actuating the mode selecting switch, the roller elevated position locking means 4 is released from the locked state so that the cam 4a is rotated, causing the master supply roller 3 to be lowered to the foremost end of the cassette 2, whereby ZnO masters $X_1$ received in the cassette 2 can be discharged one by one therefrom.

A charger 7 is disposed subsequent to an opposing pair of conveying rollers 6 in front of the cassette 2 so that a master X discharged from the cassette 2 or the manual supply portion 2a passes between the conveying rollers 6 while moving on a guide plate 5a so as to allow the upper surface and the lower surface of the master X to be electrically charged in the course of movement through the charger 7.

A certain voltage is applied to the charger 7 when the master heating switch (not shown) is shifted to OFF. As shown in FIG. 2 and FIG. 3, the charger 7 is composed of a vertically spaced opposing pair of a front surface side charger 7a and a reverse surface side charger 7b, which are provided with a charge line to electrically charge the front surface of the master X in the course of movement of the master X past the charger 7. A differential length part $d_o$ is formed between an insulating material 7e defining a charging surface 7c of the charger 7a on the upper surface side and an insulating material 7f defining a charging surface 7d of the charger 7b on the lower surface side so that an intensely charged part $d_m$ is formed between both the differential length parts $d_o$, while charge cut parts $d_s$ are formed at the opposite ends of the charger 7a located outside of the differential length portions $d_o$. The formation of the intensely charged part $d_m$ and the charge cut parts $d_s$ in the above-described manner is intended to reduce a quantity of electrical charging in the boundary of the image region of the master X in order to minimize printing-plate offset which may be recognized after completion of a developing operation.

On completion of the electrical charging, the master X is conveyed toward an exposing stage 8 while moving on a guide plate 5b. A lamp house 11 including an original board 10 is arranged at the upper part of the housing 1 of the printing-plate making apparatus. Specifically, the lamp house 11 is pivotally mounted on the housing 1 via a hinge 12 disposed at the left-hand end of the lamp house 11 as seen in FIG. 1, and moreover, it is movably supported by a pair of gas stays 13 disposed between the lamp house 11 and the housing 1 so that it is opened and closed in the B arrow-marked direction by actuating the gas stays 13. When a locking mechanism (not shown) is unlocked, the lamp house 10 is held in the opened state represented by phantom lines with the aid of the hinge 12 and the gas stays 13. In addition, the lamp house 11 can be restored to a normal state represented by solid lines by intensely depressing the lamp house 11 with an operator's hand With this construction, a maintenance service for properly controlling the interior of the housing 1 and an inspection service for checking an occurrence of paper clogging or the like can be performed easily and reliably.

The original board 10 is mounted on the upper surface of the lamp house 11 so as to move in the C arrow-marked direction. When an original is placed on the original board 10, it is irradiated with light beam emitted from an illuminating lamp 14 in the lamp house 11 so that an image of the original is formed on the master X which is moving across an exposing plate 20 past an exposing window 9 while the irradiated light beam is transmitted to the master X via reflective mirrors 15 and 16, a projecting lens 18 and a reflective mirror 19. A controller (not shown) controls movement of the original board 10 and ON/OFF of the illuminating lamp 14 in operative association with ON/OFF of the master heating switch. When the master heating switch is shifted to ON, movement of the original board 10 is stopped and the illuminating lamp 14 is turned off. A lens iris 17 disposed in front of the reflective mirror 16 is automatically regulated by actuating the mode selecting switch. For example, in case that ZnO master $X_1$ is supplied from the master cassette 2, the lens iris 17 is regulated to reduce its opening area. On the contrary, in case that OPC master $X_2$ is manually supplied with an operator's hand, the lens iris 17 is regulated to enlarge its opening area. In such manner, the type of master X to be used can be changed from one type to other type depending on properties of the master X.

Movement of the original board 10 is synchronized with movement of the master X to be conveyed by opposing pairs of conveying rollers 21 and 22 disposed on the inlet side and the outlet side of the exposing stage 8 so as to allow both the original board 10 and the master X to move at the same speed. After exposing is completed and a latent image is formed on the master X, the master X is conveyed to a next developing step 23 with the aid of opposing pairs of direction changing rollers 24 and 25 and conveying rollers 26 and 27 while moving across a guide plate 5c.

Figure 4:
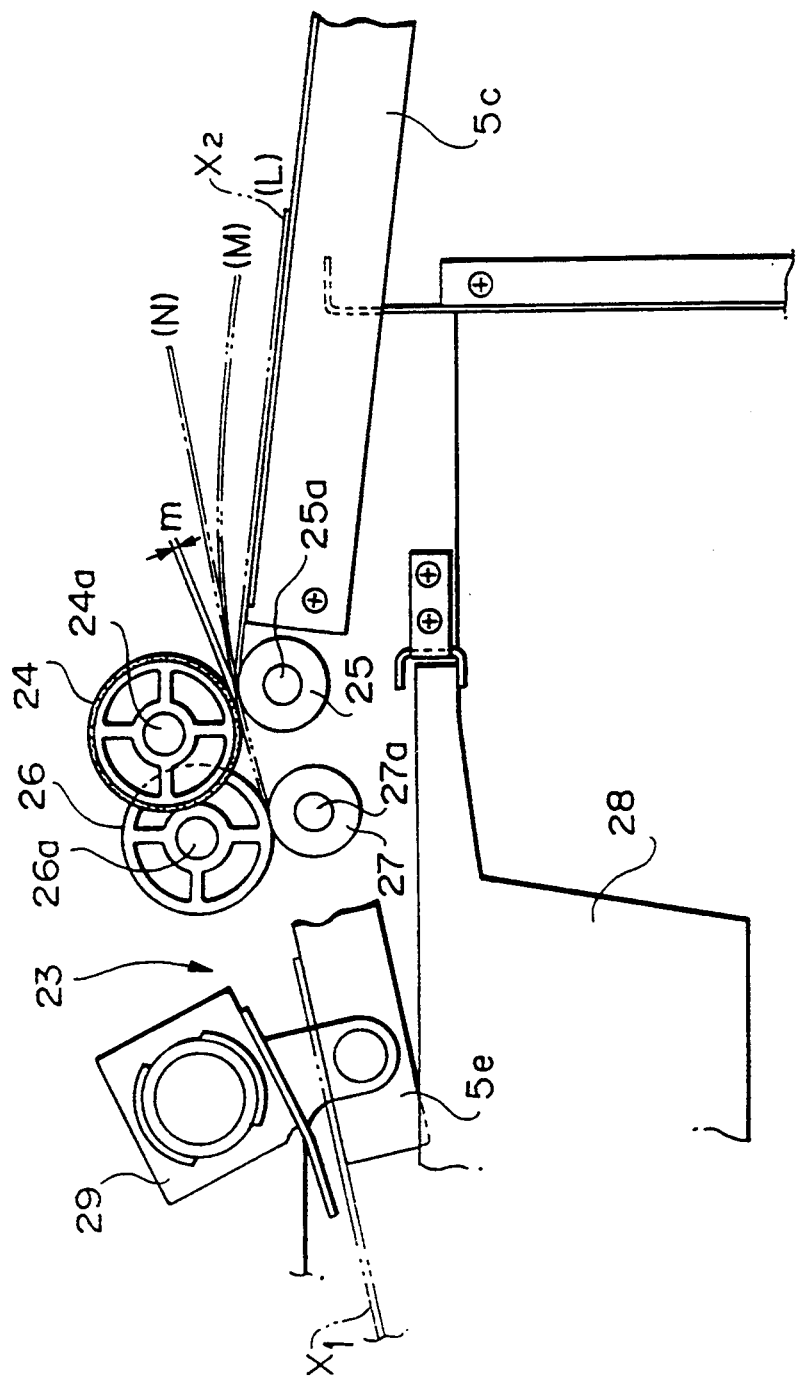
FIG. 4 is an enlarged detailed view of a direction changing roller for conveying a master toward and developing step shown in FIG. 1.

The direction changing roller 24 for conveying each master X to the developing step 23 has a predetermined width and is divided into several segments which are rotatably arranged on a shaft 24a in the equally spaced relationship while maintaining a gap of about several millimeters between the upper direction changing roller 24 and the lower rod-shaped roller 25 fixedly mounted on a driving shaft 25a. The opposing pairs of conveying rollers 26 and 27 are fixedly mounted on a rotatable shaft 26a and a driving shaft 27a, and the upper conveying roller 26 is divided into several segments which are arranged on the shaft 26a while they are sandwiched between the segments of the direction changing roller 24. As the master X moves on the guide plate 5c, the foremost end of the master X collides against the direction changing roller 24, and thereafter, the direction of movement of the master X is gradually changed in accordance with the order represented by phantom lines L, M and N in FIG. 4, because the master X is thrust in the downward direction by the direction changing roller 24. Subsequently, as the driving shaft 27a for the conveying roller 27 is rotated, the master X is conveyed further while it is held between the conveying rollers 26 and 27 in the clamped state. In addition, while the master X moves on a guide plate 5e, the electrostatic latent image on the master X is developed as a developing liquid is sprayed from a spray head 29 of a developing unit 28.

On completion of the developing, the developing liquid remaining on the master X is removed by an opposing pair of squeezing rollers 30 and an opposing pair of absorbing rollers 31, and thereafter, the master X is conveyed to a fixing step 3:2. While the master X moves on the upper surface of a panel heater 33 at a predetermined speed at the fixing step 32, it is heated up to a predetermined temperature. At this time, the whole master X is uniformly dried by blowing hot air toward it by rotation of a motor driven blower 34 disposed above the panel heater 33. A preset temperature of the panel heater 33 varies depending on properties of the master X. Especially, in case of OPC master plate $X_2$ to be supplied by employing the manual supplying process, the temperature of the panel heater 33 should be preset to be higher than that in case of ZnO master $X_1$ to be supplied by employing the cassette supplying process. For this reason, the preset temperature of the panel heater 33 is automatically changed by actuating the mode selecting switch corresponding to the properties of the master X. After the master X is dried by the panel heater 33, it is compressed from above by two rows of press rollers 35a and 35b so that the original image on the master X is fixed. Subsequently, the master X is taken out from the housing 1 of the printing-plate making apparatus as an opposing pair of discharge rollers 36 are rotated, whereby the master X is received in a discharge tray 37 disposed outside of the housing 1 of the printing-plate making apparatus.

Figure 5:
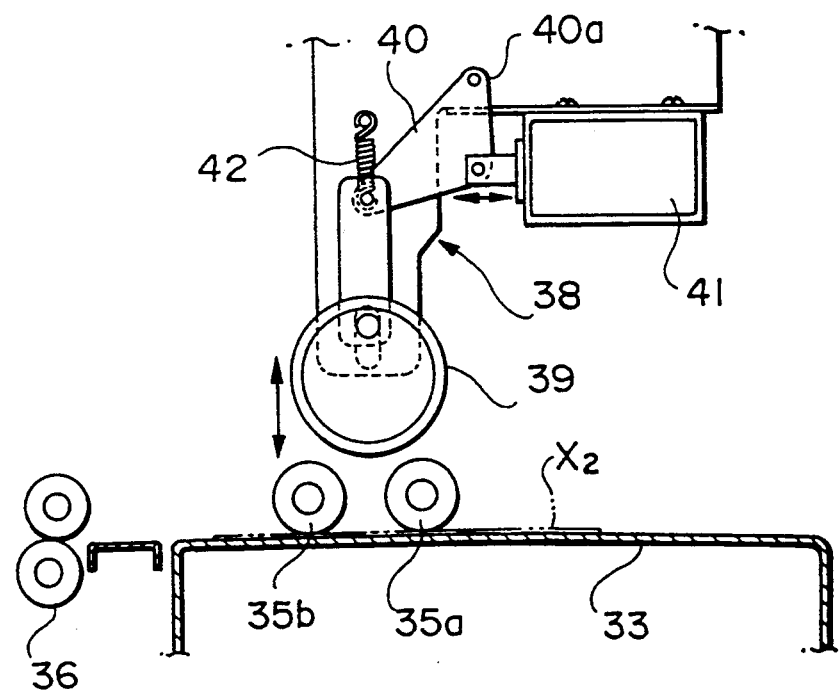
FIG. 5 is an enlarged view showing the detail of the compressing means arranged at a fixing step show in FIG. 1.

In case that the fixing is completed at the fixing step 32 by compressing the master X with the press rollers 5a and 35b, ZnO master $X_1$ supplied by employing the cassette supplying process is sufficiently fixed merely by the compressing force given by the press rollers 35a and 35b. In case of OPC master plate $X_2$ manually supplied by an operator's hand, however, there arises a problem that it can not uniformly be fixed due to shortage of the compressing force. To cope with the foregoing malfunction, compressing means 38 adapted to be displaced in the upward/downward direction is additionally arranged above the press rollers 35a and 35b as shown in FIG. 5. The compressing means 38 consists of a stationary weight 39 adapted to be brought in contact with the press rollers 35a and 35b from above, a coil spring 42 for suspending the stationary weight 39, a link arm 40 for displacing the stationary weight 39 in the upward-/downward direction and a solenoid 41 for turning the link arm 40 about a fixed fulcrum 40a. Only in case that OPC master plate $X_2$ to be manually supplied by actuating the mode selecting switch disposed on the housing 1 is selected, the solenoid 41 is activated so that the stationary weight 39 is lowered so as to thrust the press rollers 35a and 35b from above, whereby the compressing force can be enlarged.

In case of ZnO master $X_1$ supplied by employing the cassette supplying process, it can be used as a printing master as it is. On the other hand, in case of OPC master plate $X_2$ supplied by employing the manual supplying process, it is conveyed to a subsequent treatment unit in which a photosensitive layer on a non-image portion of the master plate is cleaned to prepare a printing master. With the OPC master plate, however, the plate temperature is lowered in excess of a predetermined temperature unless the plate is conveyed to the after treatment unit immediately after completion of each printing-plate making, resulting in effective cleaning of the photosensitive layer becoming impossible. For this reason, in case that no subsequent treatment is performed immediately after completion of the printing-plate making, there arises a necessity for reheating the OPC master plate. In this case, the OPC master plate is reheated up to the predetermined temperature by actuating the master heating switch disposed on the housing 1 of the printing-plate making apparatus.

Since the printing-plate making apparatus as shown in the drawings is constructed in the above-described manner according to the first embodiment of the present invention, an image of an original can be developed and fixed by way of the following steps with ZnO master $X_1$ selected by employing the cassette supplying process or OPC master plate $X_2$ selected by employing the manual supplying process depending on various conditions, e.g., a printing format, the number of sheets to be printed, whereby a master having a high quality of image of an original for printing operations formed thereon can be made.

First, the mode selecting switch disposed on the housing 1 of the printing-plate making apparatus is actuated corresponding to properties of a master X to be used. Thus, various conditions, e.g., a master supplying process, an opening area of the lens iris 17 in the exposing optical system, a temperature of the panel heater 33 at the fixing step 32 and a compressing force given by the press rollers 35a and 35b are automatically changed to optimal conditions for ZnO master $X_1$ or OPC master plate $X_2$ selected in response to the actuation of the mode selecting switch.

Subsequently, when a start button is depressed with an operator's hand after the mode selecting switch disposed on the housing 1 is selected, the selected master X is supplied by employing the cassette supplying process or the manual supplying process, and thereafter, it is conveyed to the exposing stage 8 via the charger 7. When the master X reaches to the position assumed by the sensor 9 disposed in front of the conveying roller 21 on the inlet side of the exposing stage 8, the original board 10 starts simultaneous movement in the predetermined timing relationship, and subsequently, an image on an original is formed on the master X placed on the exposing plate 20 by a light beam transmitted via the reflective mirrors 15 and 16, the lens iris 17, the projecting lens 18 and the reflective mirror 19 while the original image is illuminated by the illuminating lamp 14.

After the master X passes past the exposing stage 8, it is conveyed further by the direction changing roller 24 and the conveying rollers 26 and 27 to the developing means 23 at which a latent image is then developed by spraying a developing liquid with the spray head 29 of the developing unit 28. After completion of the developing, the master X is heated and dried with the aid of the panel heater 33 and the motor driven fan 34 arranged at the fixing step 32. Subsequently, after completion of the fixing under the compressing force given by the press rollers 35a and 35b, the master X is discharged onto the paper discharge tray 37 by rotating the discharge rollers 36.

In case that a master having an image of an original for printing operations formed on a preliminarily selected master X is made, the mode selecting switch disposed on the housing 1 of the printing-plate making apparatus is actuated prior to starting of operation of the printing-plate making apparatus so that various operative conditions, i.e., the roller elevated position locking means 4 for selectively rotating the paper supply roller 3, the lens iris 17 in the optical exposing system for building an image of an original on the master X placed on the exposing plate 20, the temperature preset for the panel heater 33 at the fixing step 32 and the compressing force given by the press rollers 35a and 35b are automatically changed to optimal conditions corresponding to the properties of a master X to be used. In such manner, a master having a high quantity of image formed thereon can be made by operating only a single printing-plate making apparatus irrespective of how the properties of each master differ from master to master.

Among masters each having an image of an original formed thereon by operating the printing-plate making machine, in case that OPC master plate $X_2$ is to be conveyed to a subsequent treatment step, an image of an original is first formed on OPC master plate $X_2$ in the housing 1 of the printing-plate making apparatus, and thereafter, the master heating switch disposed on the housing 1 is shifted to ON so as to activate the master heating unit. Subsequently, OPC master plates $X_2$ are caused to successively pass through the charger 7 arranged in the housing 1 of the printing-plate making apparatus at a predetermined elevated temperature with the aid of the master heating unit, and after completion of the charging, each electrically charged OPC master plate $X_2$ is conveyed to a subsequent treatment unit.

Figure 6:
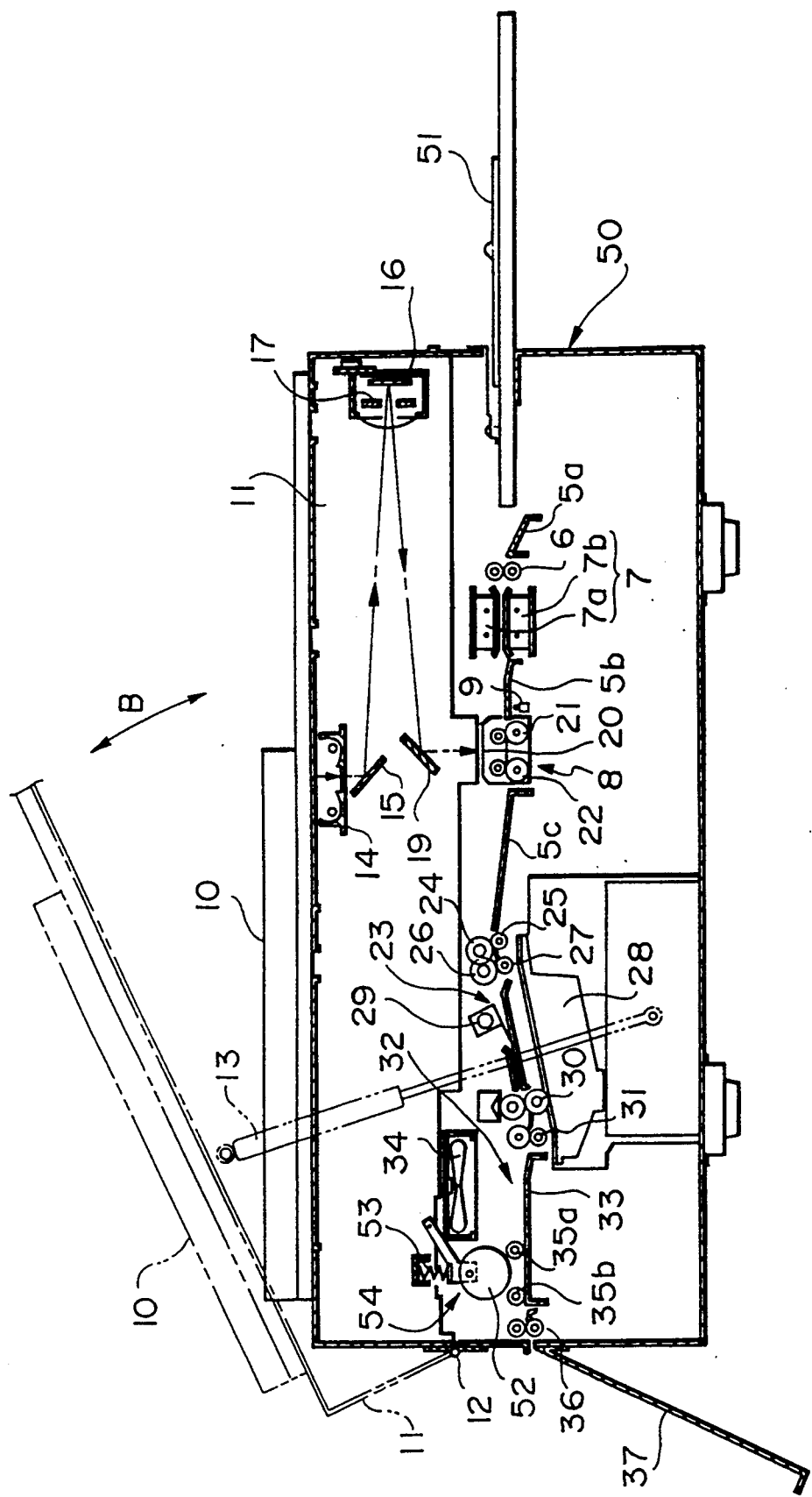
FIG. 6 is a vertical sectional view according to a second embodiment of the present invention.

FIG. 6 is a vertical sectional view of a printing-plate making apparatus constructed according to a second embodiment of the present invention, particularly showing the whole structure of the printing-plate making apparatus. Specifically, a housing 50 of the printing-plate making apparatus is designed in the form of an apparatus for exclusively making a master having an image of an original formed thereon using OPC master plates $X_2$ only. Same components as those in the housing 1 of the printing-plate making apparatus constructed according to the first embodiment of the present invention are represented by same reference numerals. Repeated description on these components will not be required.

In detail, the housing 50 of the printing-plate making apparatus includes a manual supply board 51 on the supply side of a conveying system for manually supplying OPC master plates $X_2$ one by one. A master heating switch (not shown) is disposed on a control panel mounted on the housing 50 of the printing-plate making apparatus. While the master heating switch is shifted to OFF, the housing 50 of the printing-plate making apparatus serves as a housing of a printing-plate making apparatus for exclusively handling OPC master plates $X_2$ only. On the contrary, while the master heating switch is shifted to ON, a controller (not shown) in the control panel controls a panel heater 33 such that the panel heater 33 is heated up to a preset temperature. In addition, at this time, the controller controls an original board 10, an illuminating lamp 14 and a charger 7 in such a manner that movement of the original board 10 is stopped, the illuminating lamp 14 is turned off and no voltage is applied to the charger 7, so that the panel heater serves as a master heating unit. A lens iris 17 in an optical exposing system is fixedly secured to the housing 50, and to assure that a magnitude of compressing force given by press rollers 35a and 35b can be enlarged, compressing means 54 comprising a stationary weight 52 and a coil spring 53 for resiliently thrusting the stationary weight 52 against the press rollers 35a and 35b with a predetermining magnitude of compressing force is brought in contact with the press rollers 35a and 35b from above.

Since the printing-plate making apparatus shown in FIG. 6 is constructed according to the second embodiment of the present invention in the above-described manner, an image of an original is formed on OPC master plate $X_2$ by exposure to light beam and the exposed image is then developed in the housing 50 of the printing-plate making apparatus exclusively usable for OPC master plates $X_2$ only by way of the predetermined steps using OPC master plates $X_2$ each supplied by employing a manual supplying process selected depending on operative conditions such as a printing format, the number of sheets to be printed or the like, whereby a master having a high quality of image of an original for printing operations formed thereon can be made without fail.

In case that OPC master plates $X_2$ each made in the housing 50 of the printing-plate making apparatus in the above-described manner are to be conveyed further to a subsequent treatment step, after a master having an image of an original formed on OPC master plate $X_2$ is made in the housing 50, the master heating switch disposed on the housing 50 of the printing-plate making apparatus is shifted to ON to activate the master heating unit so that the master can be conveyed to the subsequent treatment step while OPC master plates $X_2$ are heated up to a predetermined temperature with the aid of the master heating unit.

As is apparent from the above description, with the printing-plate making apparatus of the present invention, since various operative conditions, e.g., a master supplying process, an opening area of the lens iris in the optical exposing system, a temperature preset for a heater and a magnitude of compressing force given by the press rollers at the fixing step can automatically be changed to optimal conditions by actuating the mode selecting switch disposed on the housing of the printing-plate making apparatus corresponding to properties of a master to be used, e.g., zinc oxide master, organic photosensitive master plate or the like. Thus, a master having a high quality of image of an original formed thereon can be made by operating only a single printing-plate making apparatus irrespective of how properties of each master differ from master to master.

In case that OPC master plates each having an image of an original formed thereon are developed and fixed by operating the printing-plate making apparatus of the present invention, after completion of the developing and fixing of each OPC master plate, the master heating switch disposed on the housing of the printing-plate making apparatus is shifted to ON so that at least applying of a certain voltage to the charger is stopped. Since this makes it possible to serve as a master heating unit, separate or additional employment and installation of any master heating unit are not required in contrast with the conventional printing-plate making apparatus, resulting in a remarkable economical effect being obtainable with the printing-plate making apparatus of the present invention.

We claim:

1. A printing plate making apparatus comprising a housing containing:
    an exposing stage at which an original image is exposed on a master;
    means including a master supplying roller and a charger for supplying a print master to said exposing stage;
    locking means for locking said master supplying roller;
    a developing stage for developing an exposed master;
    a fixing stage including a panel heater and press rollers for fixing a developed master;
    a mode selecting switch for selectively altering operational characteristics of at least said master supplying roller, said panel heater and said press rollers; and
    a master heating switch comprising means for selectively stopping a supply of voltage to said charger and operating said panel heater as a master heating unit.

2. The apparatus of claim 1 wherein said exposing stage includes an illuminating lamp and a movable original board, wherein said master heating switch further comprises means for stopping movement of said original board and turning off said illuminating lamp when said the supply of voltage to said charger is stopped.

3. A printing plate making apparatus comprising a housing containing:
    an exposing stage at which an original image is exposed on a master;
    means including a master supplying roller and a charger for supplying a print master to said exposing stage;
    locking means for locking said master supplying roller;
    a developing stage for developing an exposed master;
    a fixing stage including a panel heater and press rollers for fixing a developed master; and
    a mode selecting switch for selectively altering operational characteristics of at least said master supplying roller, said panel heater and said press rollers;
    wherein said means for supplying a print master comprises:
     a) a master supplying cassette having an upper cover, the master supply roller being operative to supply masters from said cassette,
     b) a manual master supplying portion on an upper surface of the upper cover for supplying masters one-by-one, and
    wherein said exposing stage includes a lens having an iris.

4. The apparatus of claim 3 wherein said mode selecting switch selectively alters a size of said iris.

* * * * *